United States Patent
Sisodia et al.

(10) Patent No.: US 11,315,628 B1
(45) Date of Patent: Apr. 26, 2022

(54) TECHNIQUES FOR POWERING MEMORY

(71) Applicant: Arm Limited, Cambridge (GB)

(72) Inventors: Rajiv Kumar Sisodia, Bangalore (IN);
Andy Wangkun Chen, Austin, TX (US); Ayush Kulshrestha, New Delhi (IN); Sony, Noida (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/076,305

(22) Filed: Oct. 21, 2020

(51) Int. Cl.
*G11C 11/417* (2006.01)
*H01L 27/11* (2006.01)

(52) U.S. Cl.
CPC ........ G11C 11/417 (2013.01); H01L 27/1104 (2013.01)

(58) Field of Classification Search
CPC .............. G11C 11/417; H01L 27/1104
USPC ......................................... 365/226
See application file for complete search history.

(56) References Cited

U.S. PATENT DOCUMENTS

| | | | |
|---|---|---|---|
| 5,604,710 A * | 2/1997 | Tomishima | G11C 5/025 365/201 |
| 9,542,994 B1 * | 1/2017 | Prabhat | G11C 11/4072 |
| 11,087,832 B1 * | 8/2021 | Gomes | G11C 11/412 |
| 2005/0276132 A1 * | 12/2005 | Severson | H03K 19/0016 365/202 |
| 2006/0126416 A1 * | 6/2006 | Eun | G11C 11/22 365/226 |
| 2007/0002617 A1 * | 1/2007 | Houston | H01L 27/1104 365/185.07 |
| 2007/0189097 A1 * | 8/2007 | Kuang | G11C 5/14 365/226 |
| 2012/0250443 A1 * | 10/2012 | Saraswat | H01L 23/5286 365/226 |
| 2014/0269022 A1 * | 9/2014 | Xie | H01L 21/768 365/154 |
| 2015/0370948 A1 * | 12/2015 | Kawa | H01L 23/5226 716/119 |
| 2015/0370950 A1 * | 12/2015 | Kawa | H01L 21/823807 716/119 |
| 2016/0181257 A1 * | 6/2016 | Liaw | H01L 23/5286 257/401 |
| 2017/0053689 A1 * | 2/2017 | Noguchi | G06F 12/08 |
| 2017/0110181 A1 * | 4/2017 | Fujiwara | G11C 11/419 |
| 2018/0129270 A1 * | 5/2018 | Garg | G06F 1/3253 |
| 2018/0358347 A1 * | 12/2018 | Jeong | H01L 27/0924 |
| 2019/0094949 A1 * | 3/2019 | Kurian | G06F 1/3296 |
| 2019/0164596 A1 * | 5/2019 | Lee | G11C 11/419 |
| 2019/0213298 A1 * | 7/2019 | Correale, Jr | H01L 23/5286 |
| 2020/0075489 A1 * | 3/2020 | Liebmann | H01L 27/1104 |
| 2020/0234737 A1 * | 7/2020 | Jayapal | G11C 5/147 |
| 2021/0065751 A1 * | 3/2021 | Park | H01L 24/94 |
| 2021/0272605 A1 * | 9/2021 | Peng | H01L 23/50 |

* cited by examiner

*Primary Examiner* — Michael T Tran
(74) *Attorney, Agent, or Firm* — Pramudji Law Group PLLC; Ari Pramudji

(57) ABSTRACT

Various implementations described herein are directed to a device having memory with a first array and a second array. The device may have power rails formed in frontside metal layers that supply core voltage to the memory. The power rails may include a first path routed through a first frontside metal layer to the first array of the memory, and the power rails may include a second path routed through the first frontside metal layer and a second frontside metal layer to the second array of the memory.

20 Claims, 9 Drawing Sheets

TECHNIQUES FOR POWERING MEMORY

BACKGROUND

This section is intended to provide information relevant to understanding the various technologies described herein. As the section's title implies, this is a discussion of related art that should in no way imply that it is prior art. Generally, the related art may or may not be considered prior art. It should therefore be understood that any statement in this section should be read in this light, and not as any admission of prior art.

In some memory architecture designs, conventional power rails can be buried in memory, wherein metal power lines can be buried in the substrate, and these lines can be used as power rails for voltage distribution from backside circuitry. However, in these conventional memory designs, memory cells typically use frontside power rails for voltage distribution to frontside circuitry including the memory cells. Unfortunately, conventional memory designs are inefficient in that use of frontside power rails for memory cells suffers from area penalty in fabrication. Therefore, there exists a need to improve conventional memory designs to improve area efficiency of modern memory architecture.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Figure 1:
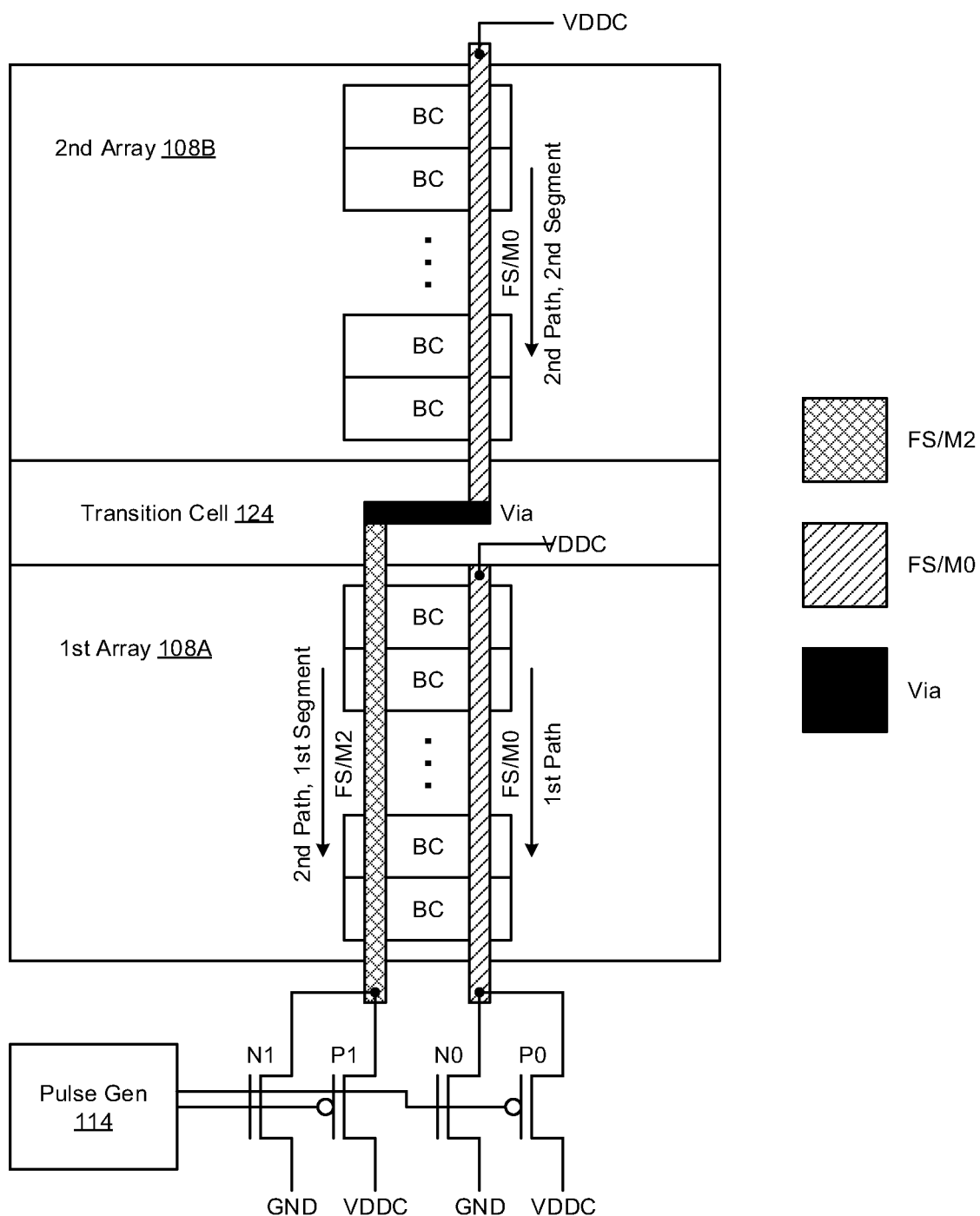
FIG. 1 illustrates a schematic diagram of memory architecture having a power distribution network (PDN) with frontside (FS) power rails in accordance with various implementations described herein.

Various implementations described herein are directed to memory architecture having a power distribution network (PDN) with frontside (FS) power rails and backside (BS) buried power rails in physical layout design. The various schemes and techniques described herein may provide for a high speed and low power memory logic with improved tracking for transient voltage collapse (TVC) in low voltage applications.

Various implementations described herein are also related to a cell architecture having buried power supply rails for backside delivery and distribution of power in memory applications. The various schemes and techniques described herein may provide for a power distribution architecture (PDN) that operates with frontside (FS) power distribution and backside (BS) power distribution for various logic applications.

In some implementations, the various backside power distribution schemes and techniques described herein may provide for random access memory (RAM) applications including static RAM (SRAM). Therefore, various implementations described herein may provide for a novel cell architecture that utilizes buried metal for critical signals in SRAM applications. In reference to backside power domains for SRAM technology, metallization may be provided frontside (e.g., above a device) and also backside (e.g., below a device) as buried power rails. In the logic domain, the buried power rails may be used to supply power to memory components in a core array such that power domains are used to avoid area penalty. Various implementations described herein may also provide for an overall power domain scheme for memory applications, including, e.g., various use of backside-to-frontside transition cells having transition vias. These aspects along with various other features and characteristics are described in greater detail herein.

In various implementations, in reference to write-assist techniques for SRAM, transient voltage collapse (TVC) has emerged as a powerful tool that enables low-voltage SRAM operation. In some scenarios, transient voltage collapse (TVC) may refer to write assist for SRAM, wherein power supplied to a selected column is lowered. Also, dynamic energy consumption may be higher when controlling core voltage (VDDC) for bitcells with capacitance that is larger than bitline capacitance. For instance, a higher capacitance of VDDC may also impact cycle-time as the time taken to pre-charge a heavily loaded VDDC to a level of a supply voltage (VDD) increases. Also, TVC circuitry may suffer from various problems related to row tracking when rows per bitline vary, e.g., from 8 to 512, and range based VDDC lowering may cause increased design efforts.

The various schemes and techniques described herein may provide for a novel memory cell architecture that is configured to improve timing and reduce dynamic power consumption, e.g., by segmenting the bitcell array and by segmenting and separating the VDDC line to reduce capacitance. Thus, the reduced effective capacitance may improve pre-charging time of VDDC and may also reduce dynamic power consumption. The novel memory cell architecture described herein may also allow for improved row tracking by reducing a range of optimization, which reduces design effort.

Various implementations of memory architecture with a novel power distribution network (PDN) along with various power distribution schemes and techniques associated therewith will be described in greater detail herein with reference to FIGS. 1-9.

FIG. 1 illustrates a diagram 100 of memory architecture 104 having frontside (FS) power rails in accordance with implementations described herein. The memory architecture 104 may include a power distribution network (PDN) with FS power rails and BS buried power rails along with transition cells 124 having vias that provide for inter-layer transitioning between multiple layers.

In various implementations, the memory architecture 104 may be implemented as a system or a device having integrated circuit (IC) components that are arranged and coupled together as an assemblage or combination of parts that provide for physical circuit designs and related structures. In some instances, a method of designing, providing and building the memory architecture 104 as an integrated system or device may involve use of various IC circuit components described herein so as to implement the backside power distribution schemes and techniques associated therewith. The memory architecture 104 may be integrated with computing circuitry and related components on a single chip, and the memory architecture 104 may also be implemented in some embedded systems for automotive, electronic, mobile, server and Internet-of-things (IoT) applications.

As shown in FIG. 1, the memory architecture 104 may have memory with one or more core memory arrays including, e.g., a first array 108A and a second array 108B with each array having multiple bitcells (BC). The memory architecture 104 may include power rails (FS/M0, FS/M2) that are formed in frontside (FS) metal layers that supply core voltage to the memory. The power rails (FS/M0, FS/M2) may include a first path routed through a first frontside metal layer (FS/M0) to the first array 108A of the memory. Also, the power rails (FS/M0, FS/M2) may have a second path routed through the first frontside metal layer (FS/M0) and a second frontside metal layer (FS/M2) to the second array 108B of the memory. In some implementations, the core voltage (VDDC) may be coupled to first ends of the power rails that are associated with the first path and the second path so as to thereby provide the core voltage (VDDC) to power supply connections of the bitcells (BC) in the first array 108A and the second array 108B of the memory.

The memory architecture 104 may include one or more transition cells 124 with one or more inter-layer transition vias that are used to couple the first frontside metal layer (FS/M0) to the second frontside metal layer (FS/M2) of the second path. Also, in various instances, the second path may be routed through the first frontside metal layer (FS/M0) and the second frontside metal layer (FS/M2) by way of the transition via.

In some implementations, as shown in FIG. 1, the first path may be disposed in the first frontside metal layer (FS/M0), and the second path may include a first segment that is disposed in the second frontside metal layer (FS/M2) and a second segment that is disposed in the first frontside metal layer (FS/M0). Also, as shown in FIG. 1, and in reference to the second path, the via in the transition cell 124 may be used to couple the first segment formed in the second frontside metal layer (FS/M2) to the second segment formed in the first frontside metal layer (FS/M0).

In some implementations, the memory architecture 104 may have one or more footer transistors (N0, P0 and N1, P1) that are coupled in pairs to the second ends of the power rails (FS/M0, FS/M2). The footer transistors (N0, P0 and N1, P1) may be N-type metal-oxide-semiconductor (MOS) devices (i.e., NMOS transistors for discharging) and/or P-type MOS devices (i.e., PMOS transistors for pre-charging). For instance, a first footer transistor (P0/PMOS) may be coupled between the first frontside metal layer (FS/M0) and VDDC for pre-charging FS/M0 to VDDC, and also, a second footer transistor (N0/NMOS) may be coupled between the first frontside metal layer (FS/M0) and ground (GND) for discharging FS/M0 to GND. Also, a third footer transistor (P1/PMOS) may be coupled between the second frontside metal layer (FS/M2) and VDDC for pre-charging FS/M2 to VDDC, and also, a fourth footer transistor (N1/NMOS) may be coupled between the second frontside metal layer (FS/M2) and ground (GND) for discharging FS/M2 to GND. In various instances, the footer transistors (N0, P0 and N1, P1) may be alternately activated and deactivated with separate pulse signals provided by a pulse generator 114 so as to thereby alternately pre-charge and discharge the power rails (FS/M0, FS/M2) based on the separate pulse signals.

In various implementations, the schemes and techniques described herein may improve write-cycle time and reduce dynamic power by reducing VDDC capacitance. For instance, the memory arrays 108A, 108B are divided into segments with VDDC separation for the multiple segments. The VDDC for a higher segment may be routed in higher metal over a lower segment, and routing may be achieved in frontside (FS) metal or in backside (BS) metal during fabrication as provided by a foundry. Also, routing in the backside metal may be used to provide flexibility to the frontside metal, and based on the resistance and capacitance of the metal, either of the frontside or backside metal may be used.

In some implementations, the memory architecture 104 may include a frontside power network (FSPN) having the frontside (FS) power rails coupled to various memory components and/or logic circuits. In some instances, the frontside power supply rails may be coupled to logic circuitry associated with bitcell arrays 108A, 108B arranged in columns and rows along with header logic and control logic. The frontside power network (FSPN) may include a number (N) of frontside metal layers (e.g., FS/M0, FS/M2).

In some implementations, the memory architecture 104 may include a backside power network (BSPN) having the backside (BS) power rails coupled to various memory components and/or logic circuits. In some instances, the backside power supply rails may be coupled to logic circuitry associated with bitcell arrays 108A, 108B arranged in columns and rows along with header logic and control logic. The backside power network (BSPN) may include a number (N) of backside metal layers (e.g., BS/BM0).

In some configurations, the memory architecture 104 may be implemented with a novel cell architecture that may provide frontside/backside metal for power distribution in various memory applications, such as, e.g., random access memory (RAM) including static RAM (SRAM). For instance, the novel cell architecture may be configured to provide backside power distribution for memory circuitry (e.g., SRAM), wherein metallization may be provided frontside above the memory circuitry and also backside below the memory circuitry as buried power rails. The novel cell architecture also utilizes buried metallization for backside-to-frontside transition cells that allows for backside distribution of power and critical signal nets to memory circuitry that is disposed frontside. The backside power rails for memory applications may be buried in the substrate and/or in related oxide layers, and these buried metal lines may be utilized as power rails for distributing power and/or signal lines for transmitting critical signals. These aspects and various other features, behaviors and characteristics are described herein in reference to FIGS. 2-9.

Figure 2:
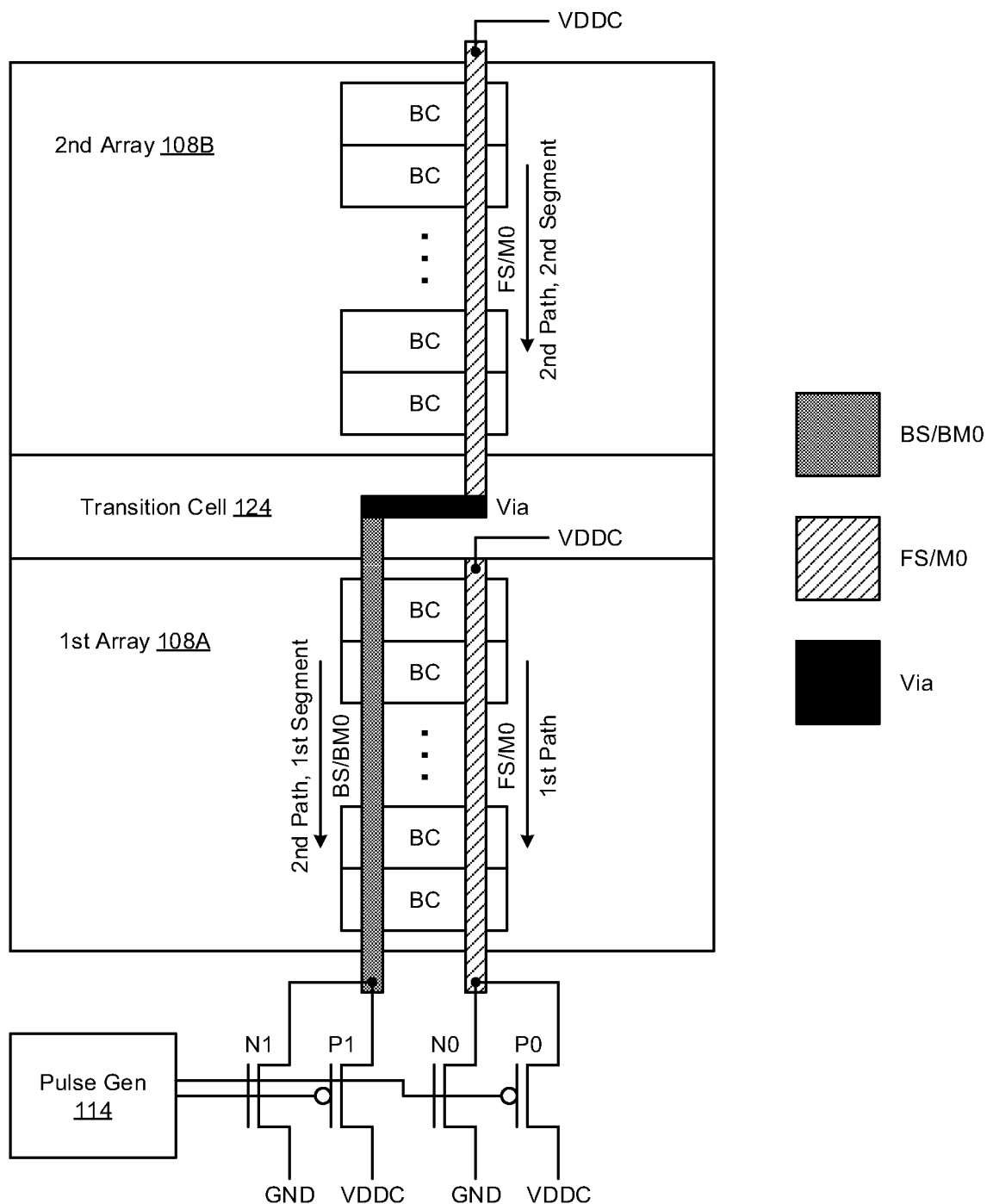
FIGS. 2-7 illustrate various other diagrams of memory architecture having the power distribution network (PDN) with frontside (FS) power rails and backside (BS) buried power rails in accordance with various implementations described herein.

FIG. 2 illustrates a diagram 200 of memory architecture 204 having frontside (FS) power rails and backside (BS) buried power rails in accordance with implementations described herein. The memory architecture 204 may have the power distribution network (PDN) with the FS power rails and the BS buried power rails along with the transition cells 124 and vias that provide for inter-layer transitioning between multiple layers. Moreover, the memory architecture 204 in FIG. 2 may have similar components and features as described in reference to the memory architecture 104 in FIG. 1.

As shown in FIG. 2, the memory architecture 204 may have memory with one or more core memory arrays including, e.g., the first and second arrays 108A, 108B along with each having multiple bitcells (BC). The memory architecture 204 may have the power rails (FS/M0, BS/BM0) formed in frontside (FS) metal layers and backside metal layers (BS) that supply core voltage to the memory. Also, the power rails (FS/M0, BS/BM0) may include a first path routed through a frontside metal layer (FS/M0) to the first array 108A of the memory. The power rails (FS/M0, BS/BM0) may have a second path routed through the frontside metal layer (FS/M0) and the backside metal layer (BS/BM0) to the second array 108B of the memory. In some implementations, the core voltage (VDDC) may be coupled to the first ends of the power rails that are associated with the first path and the second path so as to provide the core voltage (VDDC) to power supply connections of the bitcells (BC) in the first array 108A and the second array 108B of the memory.

The memory architecture 204 may include one or more transition cells 124 with the one or more inter-layer transition vias that are used to couple the frontside metal layer (FS/M0) to the backside metal layer (BS/BM0) associated with the second path. Also, in some instances, the second path may be routed through the frontside metal layer (FS/M0) and the backside metal layer (BS/BM0) by way of the transition via.

In some implementations, as shown in FIG. 2, the first path may be disposed in the frontside metal layer (FS/M0), and the second path may include a first segment that is disposed in the backside metal layer (BS/BM0) and a second segment that is disposed in the frontside metal layer (FS/M0). Also, as shown in FIG. 2, and in reference to the second path, the frontside-to-backside transition via in the transition cell 124 may be used to couple the first segment formed in the backside metal layer (BS/BM0) to the second segment formed in the frontside metal layer (FS/M0).

Figure 3:
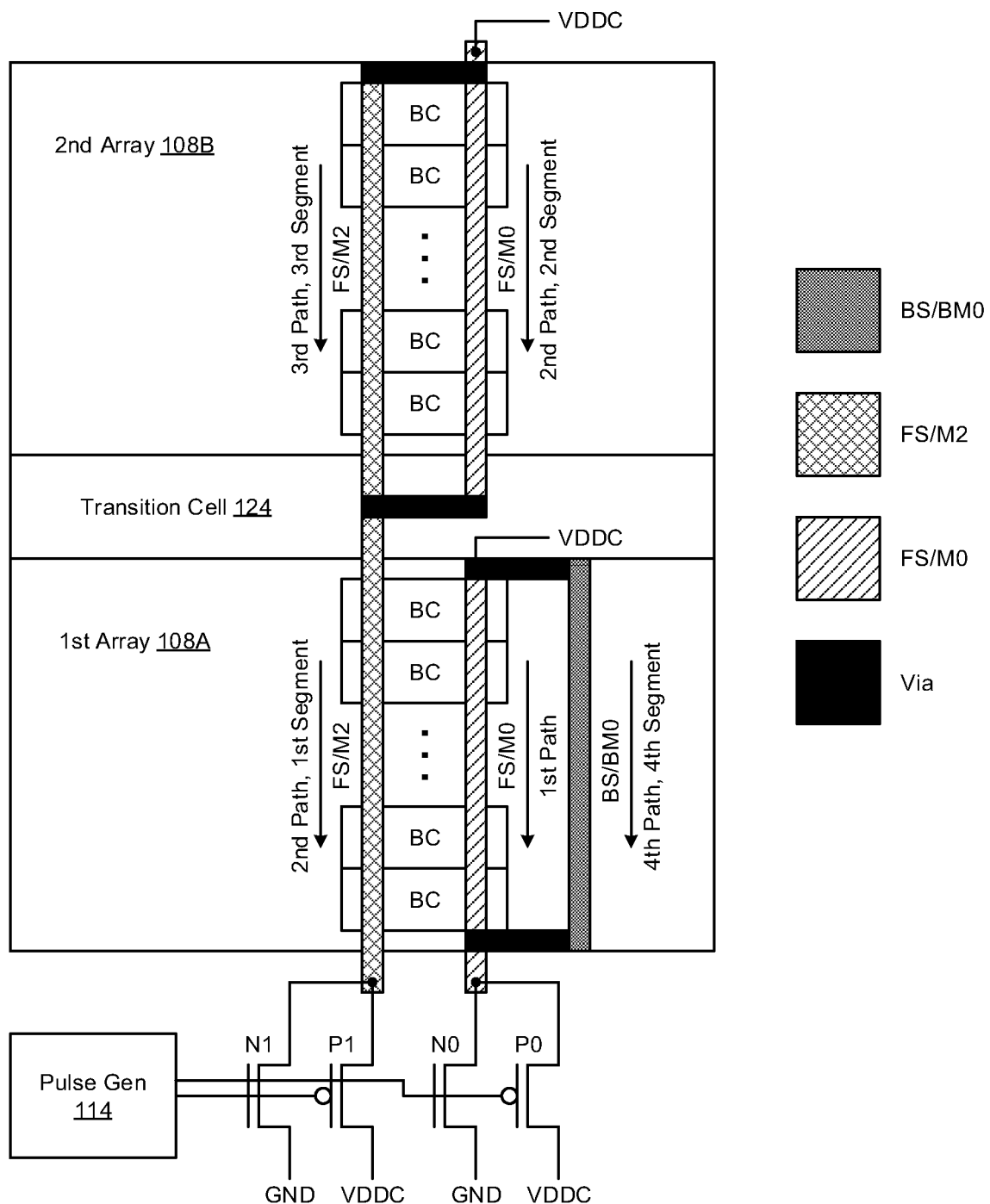

FIG. 3 illustrates a diagram 300 of memory architecture 304 having frontside (FS) power rails and backside (BS) buried power rails in accordance with implementations described herein. The memory architecture 304 may have the power distribution network (PDN) with the FS power rails and the BS buried power rails along with the transition cells 124 and vias that provide for inter-layer transitioning between multiple layers. Moreover, the memory architecture 304 in FIG. 3 may have similar components and features as described in reference to the memory architecture 104 in FIG. 1.

As shown in FIG. 3, the memory architecture 304 may have memory with one or more core memory arrays including, e.g., the first and second arrays 108A, 108B along with each having multiple bitcells (BC). The memory architecture 304 may have the power rails (FS/M0, FS/M2, BS/BM0) formed in frontside (FS) metal layers and backside metal layers (BS) that supply core voltage to memory. The power rails (FS/M0, FS/M1, BS/BM0) may include the first path routed through the frontside metal layer (FS/M0) to the first array 108A of the memory. The power rails (FS/M0, BS/BM0) may have the second path routed through multiple frontside metal layers (FS/M0, FS/M2) to the second array 108B of the memory. Also, the power rails (FS/M0, FS/M1, BS/BM0) may include a third path routed through the frontside metal layer (FS/M2) to the second array 108B of the memory, and the third path may have a third segment coupled in parallel with the second segment of the second path by way of inter-layer transition vias. Also, the power rails (FS/M0, FS/M1, BS/BM0) may include a fourth path routed through the backside metal layer (BS/BM0) to the first array 108A of the memory, and the fourth path may be coupled in parallel with the first path by way of inter-layer transition vias.

In some implementations, the core voltage (VDDC) may be coupled to the first ends of the power rails that are associated with the first path and the second path so as to provide the core voltage (VDDC) to power supply connections of the bitcells (BC) in the first array 108A and the second array 108B of the memory. The memory architecture 304 may also include one or more transition cells 124 with the one or more inter-layer transition vias that are used to couple the frontside metal layers (FS/M0, FS/M2) together and also to the backside metal layer (BS/BM0) for the second, third and fourth paths. Also, in some instances, the second and third paths may be routed through the frontside metal layers (FS/M0, FS/M2) by way of the transition via, and also, the first and fourth paths may be routed through the frontside metal layer (FS/M0) and the backside metal layer (BS/BM0), respectively, by way of the transition via.

In some implementations, as shown in FIG. 3, the first path may be disposed in the frontside metal layer (FS/M0), and also, the second path may have a first segment disposed in the frontside metal layer (FS/M2) and a second segment disposed in frontside metal layer (FS/M0). The third path may be disposed in the frontside metal layer (FS/M2), and also, the fourth path may be disposed in the backside metal layer (BS/BM0).

Also, as shown in FIG. 3, and in reference to the second path, the frontside-to-backside transition via in the transition cell 124 may be used to couple the first segment formed in the frontside metal layer (FS/M2) to the second segment formed in the frontside metal layer (FS/M0). In reference to the third path, a frontside-to-backside transition via may be used to couple the third segment formed in the frontside metal layer (FS/M2) in parallel with the second segment formed in the frontside metal layer (FS/M0). In reference to the fourth path, a frontside-to-backside transition via may be used to couple the fourth segment formed in the backside metal layer (BS/BM0) in parallel with the first path formed in the frontside metal layer (FS/M0).

Figure 4:
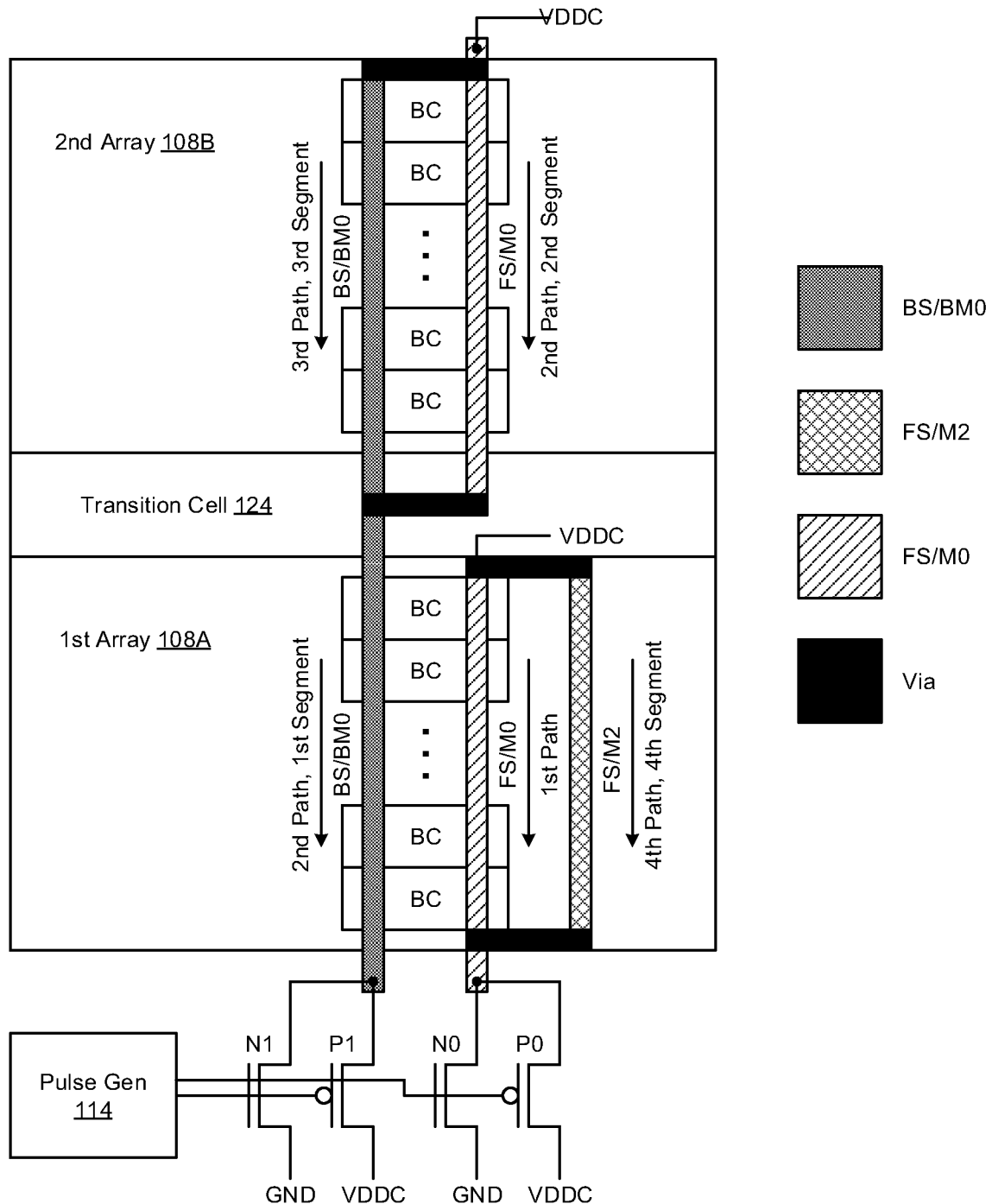

FIG. 4 illustrates a diagram 400 of memory architecture 404 having frontside (FS) power rails and backside (BS) buried power rails in accordance with implementations described herein. The memory architecture 404 may have the power distribution network (PDN) with the FS power rails and the BS buried power rails along with the transition cells 124 and vias that provide for inter-layer transitioning between multiple layers. Moreover, the memory architecture 404 in FIG. 4 may have similar components and features as described in reference to the memory architecture 104 in FIG. 1.

As shown in FIG. 4, the memory architecture 404 may have memory with one or more core memory arrays including, e.g., the first and second arrays 108A, 108B along with each having multiple bitcells (BC). The memory architecture 404 may have the power rails (FS/M0, FS/M2, BS/BM0) formed in frontside (FS) metal layers and backside metal layers (BS) that supply core voltage to memory. The power rails (FS/M0, FS/M1, BS/BM0) may include the first path routed through the frontside metal layer (FS/M0) to the first array 108A of the memory. The power rails (FS/M0, BS/BM0) may have the second path routed through frontside metal layer (FS/M0) and backside metal layer (BS/BM0) to the second array 108B of the memory. Also, the power rails (FS/M0, FS/M1, BS/BM0) may have the third path routed through the backside metal layer (BS/BM0) to the second array 108B of the memory, and the third path may have the third segment coupled in parallel with the second segment of the second path by way of inter-layer transition vias. Also, the power rails (FS/M0, FS/M1, BS/BM0) may include the fourth path routed through the frontside metal layer (FS/M2) to the first array 108A of the memory, and also, the fourth path may be coupled in parallel with the first path by way of inter-layer transition vias.

In some implementations, the core voltage (VDDC) may be coupled to the first ends of the power rails that are associated with the first path and the second path so as to provide the core voltage (VDDC) to power supply connections of the bitcells (BC) in the first array 108A and the second array 108B of the memory. The memory architecture 404 may also include one or more transition cells 124 with the one or more inter-layer transition vias that are used to couple the frontside metal layer (FS/M0) to the backside metal layer (BS/BM0) associated with the second path. Further, in some instances, the second path may be routed through the frontside metal layer (FS/M0) and the backside metal layer (BS/BM0) by way of the transition via.

In some implementations, as shown in FIG. 4, the first path may be disposed in the frontside metal layer (FS/M0), and also, the second path may have a first segment disposed in backside metal layer (BS/BM0) and a second segment disposed in frontside metal layer (FS/M0). The third path may be disposed in backside metal layer (BS/BM0), and the fourth path may be disposed in frontside metal layer (FS/M2). The third path may be routed through the backside metal layer (BS/BM0) to the second array 108B of the memory, and also, the third path may have a third segment that is coupled in parallel with the second segment of the second path by way of inter-layer transition vias. The fourth path may be routed through the frontside metal layer (FS/M2) to the first array 108A of the memory, and also, the fourth path may be coupled in parallel with the first path by way of inter-layer transition vias.

Also, as shown in FIG. 4, and in reference to the second path, the frontside-to-backside transition via in the transition cell 124 may be used to couple the first segment formed in backside metal layer (BS/BM0) to the second segment formed in frontside metal layer (FS/M0). In reference to the third path, a frontside-to-backside transition via may be used to couple the third segment formed in backside metal layer (BS/BM0) in parallel with the second segment formed in the frontside metal layer (FS/M0). Moreover, in reference to the fourth path, a frontside-to-backside transition via may be used to couple the fourth segment formed in the frontside metal layer (FS/M2) in parallel with the first path formed in the frontside metal layer (FS/M0).

Figure 5:
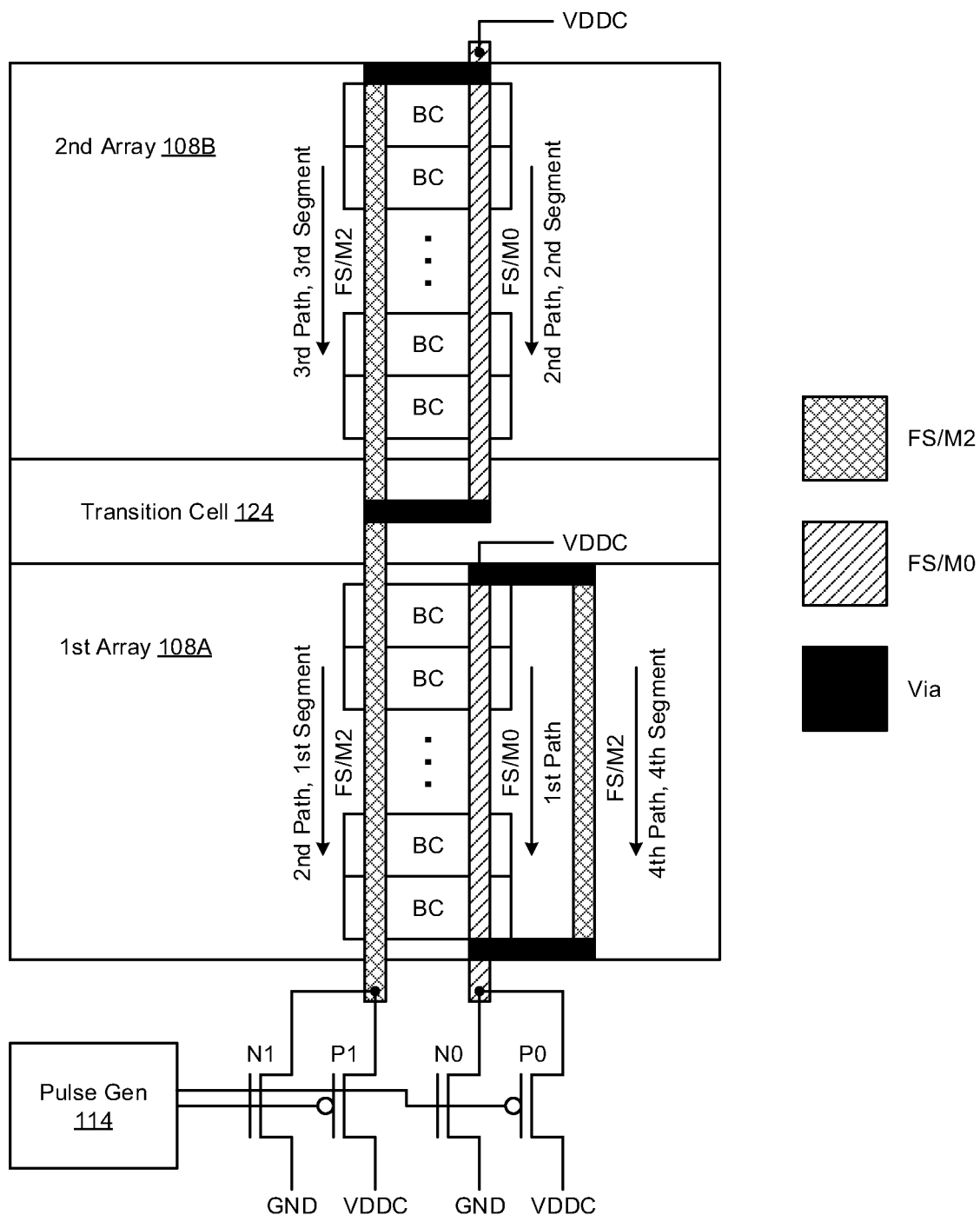

FIG. 5 illustrates a diagram 500 of memory architecture 504 having frontside (FS) power rails and backside (BS) buried power rails in accordance with implementations described herein. The memory architecture 504 may have the power distribution network (PDN) with the FS power rails along with the transition cells 124 and vias that provide for inter-layer transitioning between multiple layers. Moreover, the memory architecture 504 in FIG. 5 may have similar components and features as described in reference to the memory architecture 104 in FIG. 1.

As shown in FIG. 5, the memory architecture 504 may have memory with one or more core memory arrays including, e.g., the first and second arrays 108A, 108B along with each having multiple bitcells (BC). The memory architecture 504 may have the power rails (FS/M0, FS/M2) formed in frontside (FS) metal layers that supply core voltage to the memory. The power rails (FS/M0, FS/M1) may include the first path routed through the frontside metal layer (FS/M0) to the first array 108A of the memory, and the power rails (FS/M0) may have the second path routed through multiple frontside metal layers (FS/M0, FS/M2) to the second array 108B of the memory. Also, the power rails (FS/M0, FS/M1) may include a third path routed through the frontside metal layer (FS/M2) to the second array 108B of the memory, and the third path may have a third segment coupled in parallel with the second segment of the second path by way of inter-layer transition vias. Also, the power rails (FS/M0, FS/M1) may include a fourth path routed through the frontside metal layer (FS/M2) to the first array 108A of the memory, and also, the fourth path may be coupled in parallel with the first path by way of inter-layer transition vias.

In some implementations, the core voltage (VDDC) may be coupled to the first ends of the power rails that are associated with the first path and the second path so as to provide the core voltage (VDDC) to power supply connections of the bitcells (BC) in the first array 108A and the second array 108B of the memory. The memory architecture 504 may also include one or more transition cells 124 with the one or more inter-layer transition vias that are used to couple the frontside metal layers (FS/M0, FS/M2) associated with the second path. In some instances, the second path may be routed through the frontside metal layers (FS/M0, FS/M2) by way of the transition via.

In some implementations, as shown in FIG. 5, the first path may be disposed in the frontside metal layer (FS/M0), and also, the second path may have a first segment disposed in the frontside metal layer (FS/M2) and a second segment disposed in frontside metal layer (FS/M0). The third path may be disposed in the frontside metal layer (FS/M2), and also, the fourth path may be disposed in the frontside metal layer (FS/M2).

Also, as shown in FIG. 5, and in reference to the second path, the frontside-to-backside transition via in the transition cell 124 may be used to couple the first segment formed in the frontside metal layer (FS/M2) to the second segment formed in the frontside metal layer (FS/M0). In reference to the third path, a frontside-to-backside transition via may be used to couple the third segment formed in the frontside metal layer (FS/M2) in parallel with the second segment formed in the frontside metal layer (FS/M0). In reference to the fourth path, a frontside-to-backside transition via may be used to couple the fourth segment formed in the frontside metal layer (FS/M2) in parallel with the first path formed in the frontside metal layer (FS/M0).

Figure 6:
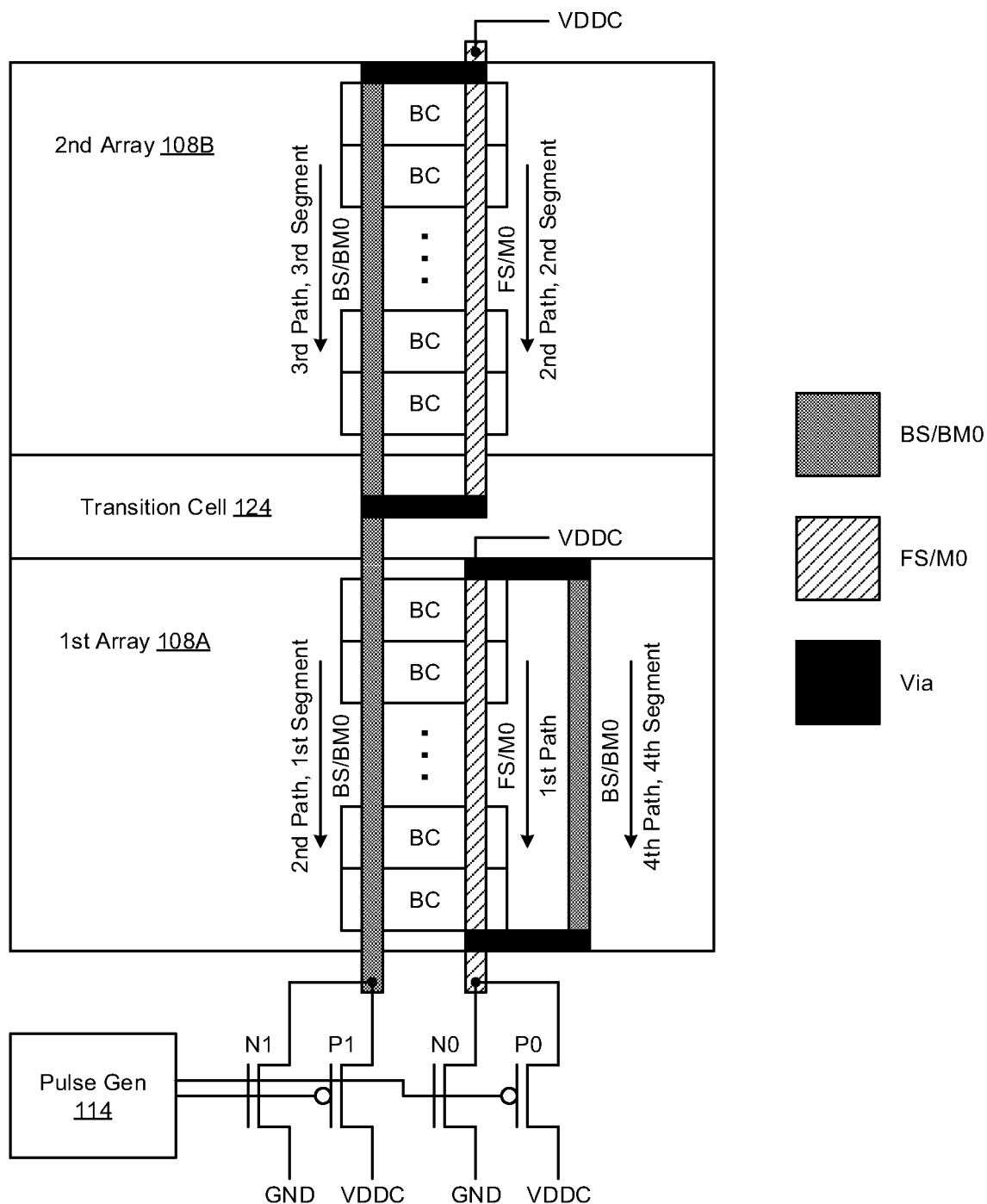

FIG. 6 illustrates a diagram 600 of memory architecture 604 having frontside (FS) power rails and backside (BS) buried power rails in accordance with implementations described herein. The memory architecture 604 may have the power distribution network (PDN) with the FS power rails and the BS buried power rails along with the transition cells 124 and vias that provide for inter-layer transitioning between multiple layers. Moreover, the memory architecture 604 in FIG. 6 may have similar components and features as described in reference to the memory architecture 104 in FIG. 1.

As shown in FIG. 6, the memory architecture 604 may have memory with one or more core memory arrays including, e.g., the first and second arrays 108A, 108B along with each having multiple bitcells (BC). The memory architecture 604 may have the power rails (FS/M0, BS/BM0) formed in the frontside (FS) metal layers and backside metal layers (BS) that supply core voltage to memory. The power rails (FS/M0, BS/BM0) may include the first path routed through the frontside metal layer (FS/M0) to the first array 108A of the memory. The power rails (FS/M0, BS/BM0) may have the second path routed through frontside metal layer (FS/M0) and backside metal layer (BS/BM0) to the second array 108B of the memory. The power rails (FS/M0, BS/BM0) may have the third path routed through the backside metal layer (BS/BM0) to the second array 108B of the memory, and the third path may have the third segment coupled in parallel with the second segment of the second path by way of inter-layer transition vias. The power rails (FS/M0, BS/BM0) may include the fourth path routed through the backside metal layer (BS/BM0) to the first array 108A of the memory, and also, the fourth path may be coupled in parallel with the first path by way of inter-layer transition vias.

In some implementations, the core voltage (VDDC) may be coupled to the first ends of the power rails that are associated with the first path and the second path so as to provide the core voltage (VDDC) to power supply connections of the bitcells (BC) in the first array 108A and the second array 108B of the memory. The memory architecture 604 may also include one or more transition cells 124 with the one or more inter-layer transition vias that are used to couple the frontside metal layer (FS/M0) to the backside metal layer (BS/BM0) associated with the second, third, and fourth paths. Further, in some instances, the second path may be routed through the frontside metal layer (FS/M0) and backside metal layer (BS/BM0) by way of the transition via.

In some implementations, as shown in FIG. 6, the first path may be disposed in the frontside metal layer (FS/M0), and also, the second path may have a first segment disposed in backside metal layer (BS/BM0) and a second segment disposed in frontside metal layer (FS/M0). The third path may be disposed in backside metal layer (BS/BM0), and the fourth path may be disposed in backside metal layer (BS/BM0). The third path may be routed through the backside metal layer (BS/BM0) to the second array 108B of the memory, and also, the third path may have a third segment that is coupled in parallel with the second segment of the second path by way of inter-layer transition vias. Further, the fourth path may be routed through the backside metal layer (BS/BM0) to the first array 108A of the memory, and also, the fourth path may be coupled in parallel with the first path by way of inter-layer transition vias.

Also, as shown in FIG. 6, and in reference to the second path, the frontside-to-backside transition via in the transition cell 124 may be used to couple the first segment formed in backside metal layer (BS/BM0) to the second segment formed in frontside metal layer (FS/M0). In reference to the third path, a frontside-to-backside transition via may be used to couple the third segment formed in backside metal layer (BS/BM0) in parallel with the second segment formed in the frontside metal layer (FS/M0). Moreover, in reference to the fourth path, a frontside-to-backside transition via may be used to couple the fourth segment formed in the backside metal layer (BS/BM0) in parallel with the first path formed in the frontside metal layer (FS/M0).

Figure 7:
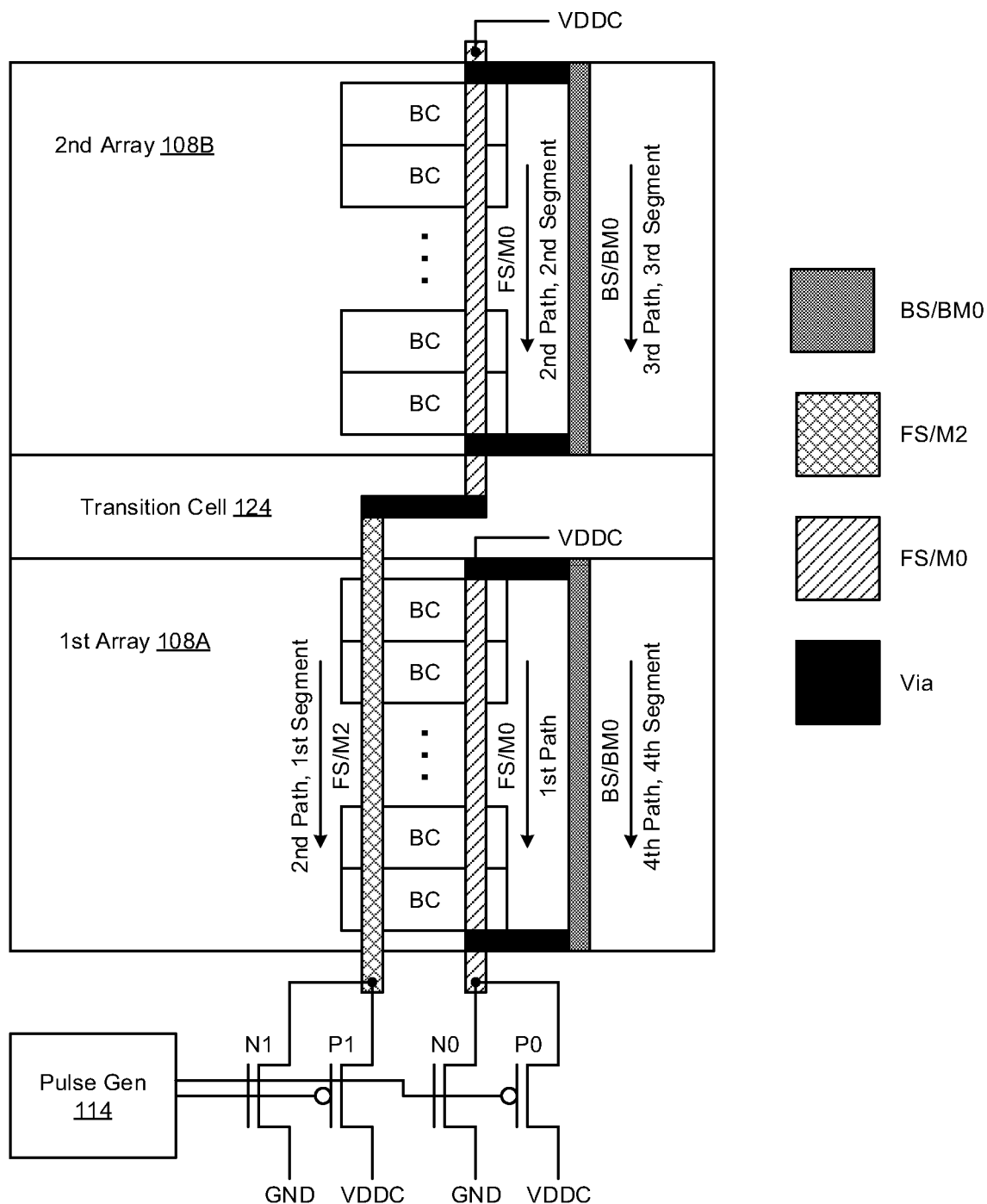

FIG. 7 illustrates a diagram 700 of memory architecture 704 having frontside (FS) power rails and backside (BS) buried power rails in accordance with implementations described herein. The memory architecture 704 may have the power distribution network (PDN) with the FS power rails and the BS buried power rails along with the transition cells 124 and vias that provide for inter-layer transitioning between multiple layers. Moreover, the memory architecture 704 in FIG. 7 may have similar components and features as described in reference to the memory architecture 104 in FIG. 1.

As shown in FIG. 7, the memory architecture 704 may have memory with one or more core memory arrays including, e.g., the first and second arrays 108A, 108B along with each having multiple bitcells (BC). The memory architecture 704 may have the power rails (FS/M0, FS/M2, BS/BM0) formed in frontside (FS) metal layers and backside metal layers (BS) that supply core voltage to memory. The power rails (FS/M0, FS/M1, BS/BM0) may include the first path routed through the frontside metal layer (FS/M0) to the first array 108A of the memory. The power rails (FS/M0, BS/BM0) may have the second path routed through multiple frontside metal layers (FS/M0, FS/M2) to the second array 108B of the memory. Also, the power rails (FS/M0, FS/M1, BS/BM0) may include a third path routed through the backside metal layer (BS/BM0) to the second array 108B of the memory, and the third path may have a third segment coupled in parallel with the second segment of the second path by way of inter-layer transition vias. Also, the power rails (FS/M0, FS/M1, BS/BM0) may include a fourth path routed through the backside metal layer (BS/BM0) to the first array 108A of the memory, and the fourth path may be coupled in parallel with the first path by way of inter-layer transition vias.

In some implementations, the core voltage (VDDC) may be coupled to the first ends of the power rails that are associated with the first path and the second path so as to provide the core voltage (VDDC) to power supply connections of the bitcells (BC) in the first array 108A and the second array 108B of the memory. The memory architecture 704 may also include one or more transition cells 124 with the one or more inter-layer transition vias that are used to couple the frontside metal layers (FS/M0, FS/M2) together and also to the backside metal layer (BS/BM0) for the second, third and fourth paths. Also, in some instances, the second path may be routed through frontside metal layers (FS/M0, FS/M2) by way of the transition via, and also, the first, third and fourth paths may be routed through the frontside metal layer (FS/M0) and the backside metal layer (BS/BM0), respectively, by way of the transition via.

In some implementations, as shown in FIG. 7, the first path may be disposed in the frontside metal layer (FS/M0), and also, the second path may have a first segment disposed in the frontside metal layer (FS/M2) and a second segment disposed in frontside metal layer (FS/M0). The third path may be disposed in backside metal layer (BS/BM0), and also, the fourth path may be disposed in backside metal layer (BS/BM0).

Also, as shown in FIG. 7, and in reference to the second path, the frontside-to-backside transition via in the transition cell 124 may be used to couple the first segment formed in the frontside metal layer (FS/M2) to the second segment formed in the frontside metal layer (FS/M0). In reference to the third path, a frontside-to-backside transition via may be used to couple the third segment formed in the backside metal layer (BS/BM0) in parallel with the second segment formed in the frontside metal layer (FS/M0). In reference to the fourth path, a frontside-to-backside transition via may be used to couple the fourth segment formed in the backside metal layer (BS/BM0) in parallel with the first path formed in the frontside metal layer (FS/M0).

Figure 8:
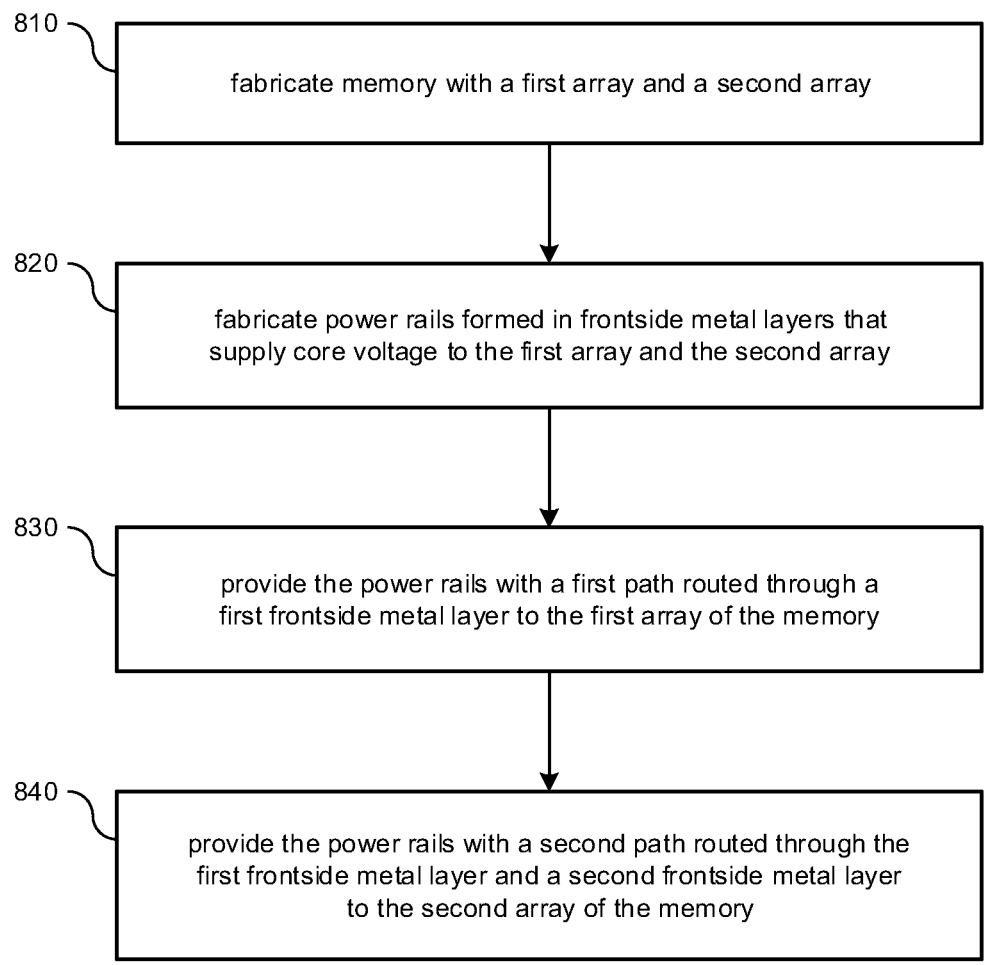
FIGS. 8-9 illustrate process flow diagrams of various methods for fabricating memory architecture with a power distribution network (PDN) in accordance with various implementations described herein.

FIG. 8 illustrates a process flow diagram of a method 800 for providing buried power rail (BPR) architecture in accordance with implementations described herein.

It should be understood that even though the method 800 indicates a particular order of operation execution, in some cases, various particular portions of the operations may be executed in a different order, and on different systems. In other cases, additional operations and/or steps may be added to and/or omitted from method 800. Also, method 800 may be implemented in hardware and/or software. If implemented in hardware, the method 800 may be implemented with various components and/or circuitry, as described herein in reference to FIGS. 1-7. Also, if implemented in software, the method 800 may be implemented as a program and/or software instruction process configured for providing various backside power distribution schemes and techniques, as described herein. Also, if implemented in software, various instructions related to implementing method 800 may be stored in memory and/or a database. For instance, various types of computing devices having a processor and memory may be configured to perform method 800.

In various implementations, the method 800 may refer to a method of designing, providing, building, fabricating and/or manufacturing backside power rail architecture as an integrated system, device and/or circuit that may involve use of the various IC circuit components described herein so as to implement backside power distribution schemes and techniques associated therewith. In some implementations, the backside power rail architecture may be integrated with computing circuitry and other related components on a single chip, and the backside power distribution circuitry may be implemented in various embedded systems for automotive, electronic, mobile, server and Internet-of-things (IoT) applications, including remote sensor nodes.

At block 810, method 800 may fabricate memory with one or more core memory arrays including a first array and a second array. At block 820, method 800 may fabricate a power distribution network with power rails formed in frontside metal layers that supply core voltage to the memory. At block 830, method 800 may provide the power rails with a first path routed through a first frontside metal layer to the first array of the memory. At block 840, method 800 may provide the power rails with a second path routed through the first frontside metal layer and a second frontside metal layer to the second array of the memory. In some instances, the first array and the second array may each have a number of bitcells, and the core voltage may be coupled to first ends of the power rails associated with the first path and the second path so as to provide the core voltage to power supply connections of the bitcells in the first array and the second array of the memory.

In various implementations, method 800 may fabricate one or more inter-layer transition vias that couple the first frontside metal layer to the second frontside metal layer of the second path. The second path may be routed through the first frontside metal layer and the second frontside metal layer by way of the one or more transition vias. Moreover, method 800 may also provide footer transistors that are coupled to second ends of the power rails, wherein each footer transistor may be alternately activated and deactivated with separate pulse signals so as to alternately pre-charge and discharge the power rails based on the separate pulse signals.

In various implementations, the second path may have a first segment disposed in the second frontside metal layer and a second segment disposed in the first frontside metal layer. The power rails may include a third path routed through the second frontside metal layer to the second array of the memory, and also, the third path may have a third segment that is coupled in parallel with the second segment of the second path by way of inter-layer transition vias. The power rails may include a fourth path that is routed through a backside metal layer to the first array of the memory, and the fourth path may be coupled in parallel with the first path by way of inter-layer transition vias. Also, the power rails may include a fourth path routed through the second frontside metal layer to the first array of the memory, and the fourth path may be coupled in parallel with the first path by way of inter-layer transition vias.

Figure 9:
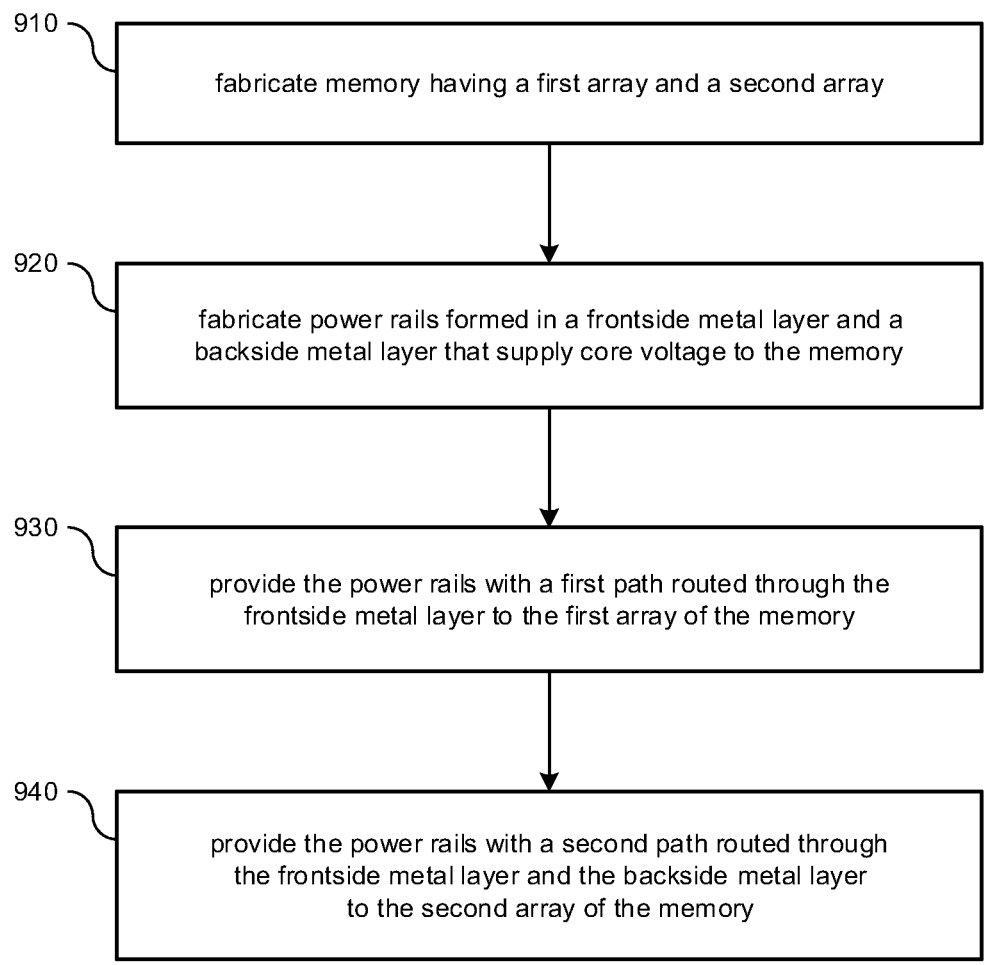

FIG. 9 illustrates a process flow diagram of a method 900 for providing buried power rail (BPR) architecture in accordance with implementations described herein.

It should be understood that even though the method 900 indicates a particular order of operation execution, in some cases, various particular portions of the operations may be executed in a different order, and on different systems. In other cases, additional operations and/or steps may be added to and/or omitted from method 900. Also, method 900 may be implemented in hardware and/or software. If implemented in hardware, the method 900 may be implemented with various components and/or circuitry, as described herein in reference to FIGS. 1-7. Also, if implemented in software, the method 900 may be implemented as a program and/or software instruction process configured for providing various backside power distribution schemes and techniques, as described herein. Also, if implemented in software, various instructions related to implementing method 900 may be stored in memory and/or a database. For instance, various types of computing devices having a processor and memory may be configured to perform method 900.

In various implementations, the method 900 may refer to a method of designing, providing, building, fabricating and/or manufacturing backside power rail architecture as an integrated system, device and/or circuit that may involve use of the various IC circuit components described herein so as to implement backside power distribution schemes and techniques associated therewith. In some implementations, the backside power rail architecture may be integrated with computing circuitry and other related components on a single chip, and the backside power distribution circuitry may be implemented in various embedded systems for automotive, electronic, mobile, server and Internet-of-things (IoT) applications, including remote sensor nodes.

At block 910, method 900 may fabricate memory with one or more core memory arrays including a first array and a second array. At block 920, method 900 may fabricate power rails formed in a frontside metal layer and a backside metal layer that supply core voltage to the memory. At block 930, method 900 may provide the power rails with a first path routed through the frontside metal layer to the first array of the memory, and at block 940, method 900 may also provide the power rails with a second path routed through the frontside metal layer and the backside metal layer to the second array of the memory. In some implementations, the first array and the second array may each have bitcells, and the core voltage may be coupled to first ends of the power rails associated with the first path and the second path so as to provide the core voltage to power supply connections of the bitcells in the first array and the second array of the memory.

In various implementations, method 900 may fabricate one or more inter-layer transition vias that couple the frontside metal layer to the backside metal layer, and also, the second path may be routed through the frontside metal layer and the backside metal layer by way of the one or more transition vias. The second path may have a first segment that is disposed in the backside metal layer and a second segment that is disposed in the frontside metal layer. Also, method 800 may provide footer transistors coupled to second ends of the power rails, wherein each of the footer transistors may be alternately activated and deactivated with separate pulse signals so as to alternately pre-charge and discharge the power rails based on the separate pulse signals.

In some implementations, the power rails may have a third path routed through the backside metal layer to the second array of the memory, and the third path may have a third segment that is coupled in parallel with the second segment of the second path by way of inter-layer transition vias. The frontside metal layer refers to a first frontside metal layer, and the power rails may have a fourth path routed through a second frontside metal layer to the first array of the memory. The fourth path may be coupled in parallel with the first path by way of inter-layer transition vias. Also, the power rails may have a fourth path routed through the backside metal layer to the first array of the memory, and the fourth path is coupled in parallel with the first path by way of inter-layer transition vias.

The various schemes and techniques described herein provide advantages in physical layout design for memory applications. In some instances, faster pull-down and faster pull-up of the VDDC net may be achieved in physical design to improve cycle-time, and also, reducing dynamic power may be achieved in physical design by reducing the effective VDDC capacitance. Further, in some instances, improved row-tracking may be achieved to reduce rows per bitline (rpbl) spread so as to thereby improve dynamic power due to lower variations. Moreover, the various schemes and techniques described herein may provide for a faster design turnaround in fabrication.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having memory with a first array and a second array. The device may include power rails formed in frontside metal layers that supply core voltage to the memory. The power rails may include a first path routed through a first frontside metal layer to the first array of the memory, and also, the power rails may include a second path routed through the first frontside metal layer and a second frontside metal layer to the second array of the memory.

Described herein are various implementations of a device having memory with a first array and a second array. The device may include power rails formed in a frontside metal layer and a backside metal layer that supply core voltage to the memory. The power rails may have a first path routed through the frontside metal layer to the first array of the memory, and also, the power rails may have a second path routed through the frontside metal layer and the backside metal layer to the second array of the memory.

Described herein are various implementations of a method. The method may include fabricating memory with a first array and a second array. The method may include fabricating power rails formed in frontside metal layers that supply core voltage to the first array and the second array of the memory. The method may include providing the power rails with a first path routed through a first frontside metal layer to the first array of the memory, and the method may include providing the power rails with a second path routed through the first frontside metal layer and a second frontside metal layer to the second array of the memory.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing refers to implementations of various techniques described herein, various other and further implementations may be devised in accordance with the disclosure herein, which may be determined by the claims that follow.

Although the subject matter has been described in language that is specific to various structural features and/or methodological acts, it is to be understood that subject matter defined in the appended claims is not necessarily limited to the specific features or acts described above. Rather, specific features and acts described above are disclosed as example forms of implementing the claims.

What is claimed is:

1. A device, comprising:
memory having a first array and a second array, wherein the first array has first bitcells, and wherein the second array has second bitcells; and
power rails formed in frontside metal layers that supply core voltage to the memory;
wherein the power rails include a first path routed through a first frontside metal layer to the first bitcells in the first array of the memory, and
wherein the power rails include a second path routed through the first frontside metal layer and a second frontside metal layer to the second bitcells in the second array of the memory.

2. The device of claim 1, further comprising:
an inter-layer transition via that couples the first frontside metal layer to the second frontside metal layer of the second path,
wherein the second path is routed through the first frontside metal layer and the second frontside metal layer by way of the transition via.

3. The device of claim 1, wherein:
the second path has a first segment disposed in the second frontside metal layer and a second segment disposed in the first frontside metal layer.

4. A device, comprising:
memory having a first array and a second array; and
power rails formed in frontside metal layers that supply core voltage to the memory,
wherein the power rails include a first path routed through a first frontside metal layer to the first array of the memory,
wherein the power rails include a second path routed through the first frontside metal layer and a second frontside metal layer to the second array of the memory,
wherein the second path has a first segment disposed in the second frontside metal layer and a second segment disposed in the first frontside metal layer,
wherein the power rails include a third path routed through the second frontside metal layer to the second array of the memory, and
wherein the third path has a third segment that is coupled in parallel with the second segment of the second path by way of inter-layer transition vias.

5. The device of claim 4, wherein:
the power rails include a fourth path routed through a backside metal layer to the first array of the memory, and
the fourth path is coupled in parallel with the first path by way of inter-layer transition vias.

6. The device of claim 4, wherein:
the power rails include a fourth path routed through the second frontside metal layer to the first array of the memory, and
the fourth path is coupled in parallel with the first path by way of inter-layer transition vias.

7. A device, comprising:
memory having a first array and a second array; and
power rails formed in frontside metal layers that supply core voltage to the memory,
wherein the power rails include a first path routed through a first frontside metal layer to the first array of the memory,
wherein the power rails include a second path routed through the first frontside metal layer and a second frontside metal layer to the second array of the memory,
wherein the first array and the second array have bitcells, and
wherein the core voltage is coupled to first ends of the power rails associated with the first path and the second path to thereby provide the core voltage to power supply connections of the bitcells in the first array and the second array of the memory.

8. The device of claim 7, further comprising:
footer transistors coupled to second ends of the power rails, and
each of the footer transistors are alternately activated and deactivated with separate pulse signals so as to thereby alternately pre-charge and discharge the power rails based on the separate pulse signals.

9. A device, comprising:
memory having a first array and a second array; and
power rails formed in a frontside metal layer and a backside metal layer that supply core voltage to the memory;
wherein the power rails include a first path routed through the frontside metal layer to the first array of the memory, and
wherein the power rails include a second path routed through the frontside metal layer and the backside metal layer to the second array of the memory.

10. The device of claim 9, further comprising:
an inter-layer transition via that couples the frontside metal layer to the backside metal layer, wherein the second path is routed through the frontside metal layer and the backside metal layer by way of the transition via.

11. The device of claim 9, wherein:
the second path has a first segment disposed in the backside metal layer and a second segment disposed in the frontside metal layer.

12. A device, comprising:
memory having a first array and a second array; and
power rails formed in a frontside metal layer and a backside metal layer that supply core voltage to the memory,
wherein the power rails include a first path routed through the frontside metal layer to the first array of the memory,
wherein the power rails include a second path routed through the frontside metal layer and the backside metal layer to the second array of the memory,
wherein the second path has a first segment disposed in the backside metal layer and a second segment disposed in the frontside metal layer,
wherein the power rails include a third path routed through the backside metal layer to the second array of the memory, and
wherein the third path has a third segment that is coupled in parallel with the second segment of the second path by way of inter-layer transition vias.

13. The device of claim 12, wherein:
the frontside metal layer refers to a first frontside metal layer,
the power rails include a fourth path routed through a second frontside metal layer to the first array of the memory, and
the fourth path is coupled in parallel with the first path by way of inter-layer transition vias.

14. The device of claim 12, wherein:
the power rails include a fourth path routed through the backside metal layer to the first array of the memory, and the fourth path is coupled in parallel with the first path by way of inter-layer transition vias.

15. A device, comprising:

memory having a first array and a second array; and power rails formed in a frontside metal layer and a backside metal layer that supply core voltage to the memory, wherein the power rails include a first path routed through the frontside metal layer to the first array of the memory, and wherein the power rails include a second path routed through the frontside metal layer and the backside metal layer to the second array of the memory, wherein the first array and the second array have bitcells, and wherein the core voltage is coupled to first ends of the power rails associated with the first path and the second path to thereby provide the core voltage to power supply connections of the bitcells in the first array and the second array of the memory.

16. The device of claim 15, further comprising:

footer transistors coupled between second ends of the power rails and ground, and each of the footer transistors are alternately activated and deactivated with separate pulse signals so as to thereby alternately pre-charge and discharge the power rails based on the separate pulse signals.

17. A method, comprising:

fabricating memory with a first array and a second array, wherein the first array has first bitcells, and wherein the second array has second bitcells;

fabricating power rails formed in frontside metal layers that supply core voltage to the first array and the second array of the memory;

providing the power rails with a first path routed through a first frontside metal layer to the first bitcells in the first array of the memory; and providing the power rails with a second path routed through the first frontside metal layer and a second frontside metal layer to the second bitcells in the second array of the memory.

18. The method of claim 17, further comprising:

fabricating an inter-layer transition via that couples the first frontside metal layer to the second frontside metal layer of the second path; and routing the second path through the first frontside metal layer and the second frontside metal layer by way of the transition via.

19. A method, comprising:

fabricating memory having a first array and a second array;

fabricating power rails formed in a frontside metal layer and a backside metal layer that supply core voltage to the memory;

providing the power rails with a first path routed through the frontside metal layer to the first array of the memory; and providing the power rails with a second path routed through the frontside metal layer and the backside metal layer to the second array of the memory.

20. The method of claim 19, further comprising:

fabricating an inter-layer transition via that couples the frontside metal layer to the backside metal layer; and routing the second path through the frontside metal layer and the backside metal layer by way of the transition via.

* * * * *